United States Patent [19]

Fry

[11] Patent Number: 5,786,278
[45] Date of Patent: Jul. 28, 1998

[54] METHOD OF STRESS-RELIEVING SILICON OXIDE FILMS

[75] Inventor: H. Wallace Fry, Scotts Valley, Calif.

[73] Assignee: Watkins-Johnson Company, Palo Alto, Calif.

[21] Appl. No.: 704,227

[22] Filed: Aug. 27, 1996

[51] Int. Cl.$^6$ ................................................. H01L 21/31
[52] U.S. Cl. ................................................. 438/787
[58] Field of Search ........................... 427/579; 438/787

[56] References Cited

U.S. PATENT DOCUMENTS

| | | | |
|---|---|---|---|
| 4,912,087 | 3/1990 | Aslam et al. | 505/1 |
| 4,943,558 | 7/1990 | Soltis et al. | 505/1 |
| 5,175,123 | 12/1992 | Vasquez et al. | 437/70 |
| 5,275,851 | 1/1994 | Fonash et al. | 427/578 |
| 5,399,389 | 3/1995 | Hieber et al. | 427/579 |
| 5,451,430 | 9/1995 | Anthony et al. | 427/372.2 |
| 5,503,882 | 4/1996 | Dawson | 427/579 |
| 5,569,499 | 10/1996 | Maeda et al. | 427/539 |

Primary Examiner—Charles L. Bowers, Jr.
Assistant Examiner—Reneé R. Berry
Attorney, Agent, or Firm—Flehr Hohbach Test Albritton & Herbert LLP

[57] ABSTRACT

A method of converting tensile stress in an APCVD oxide film at low temperature to compressive stress. The oxide film is subjected to pressures above atmospheric pressures and temperatures below the atmospheric pressure conversion temperature. This enables films to be converted to compressive stress without thermal damage to the underlying integrated circuit.

19 Claims, 2 Drawing Sheets

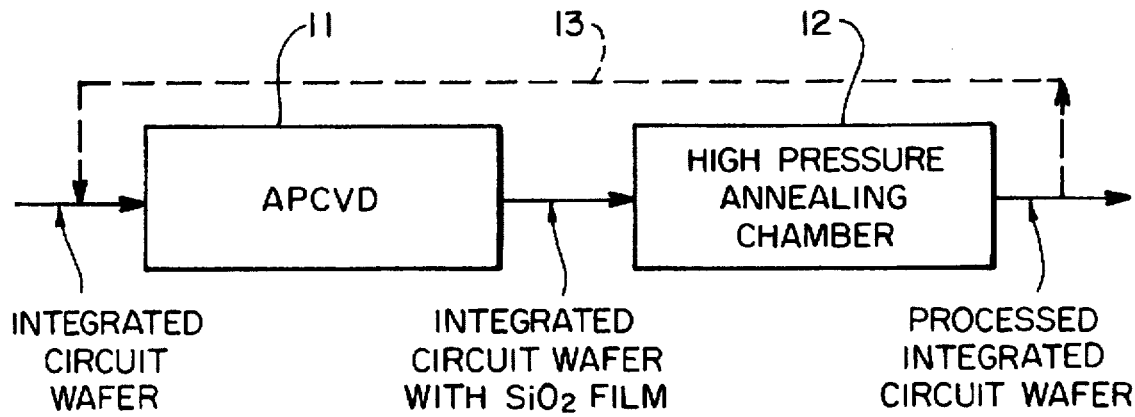
FIG_1
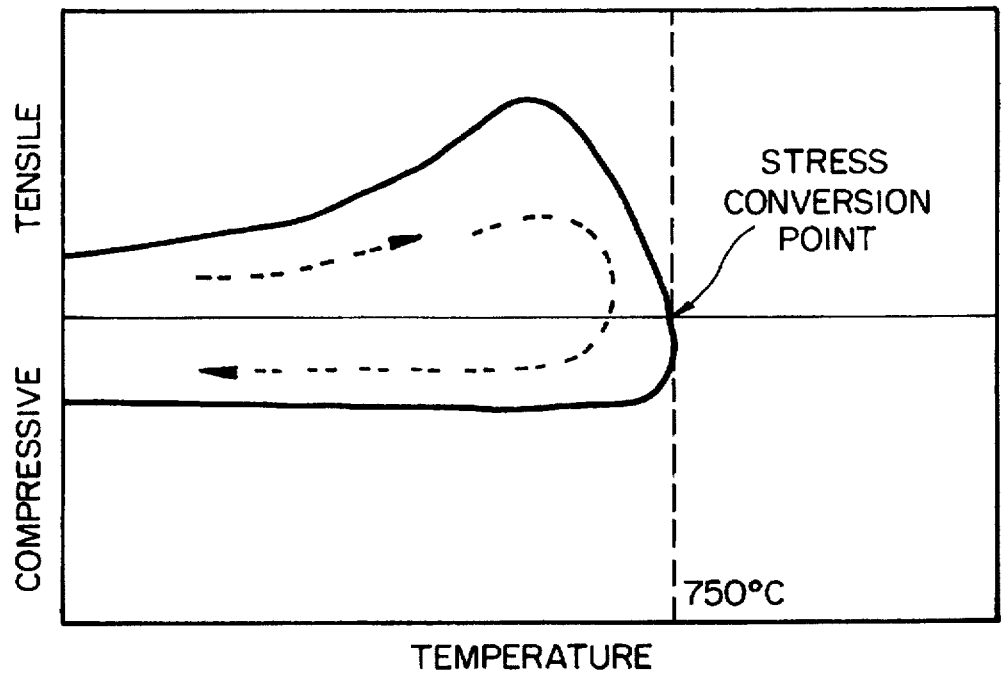
FIG_2

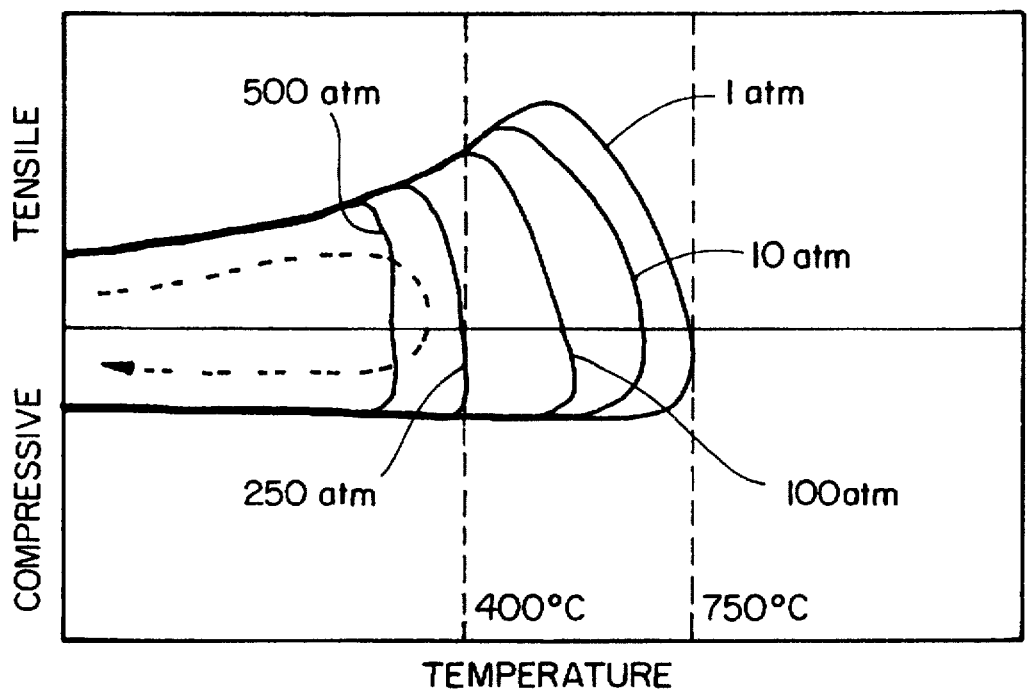
FIG_3
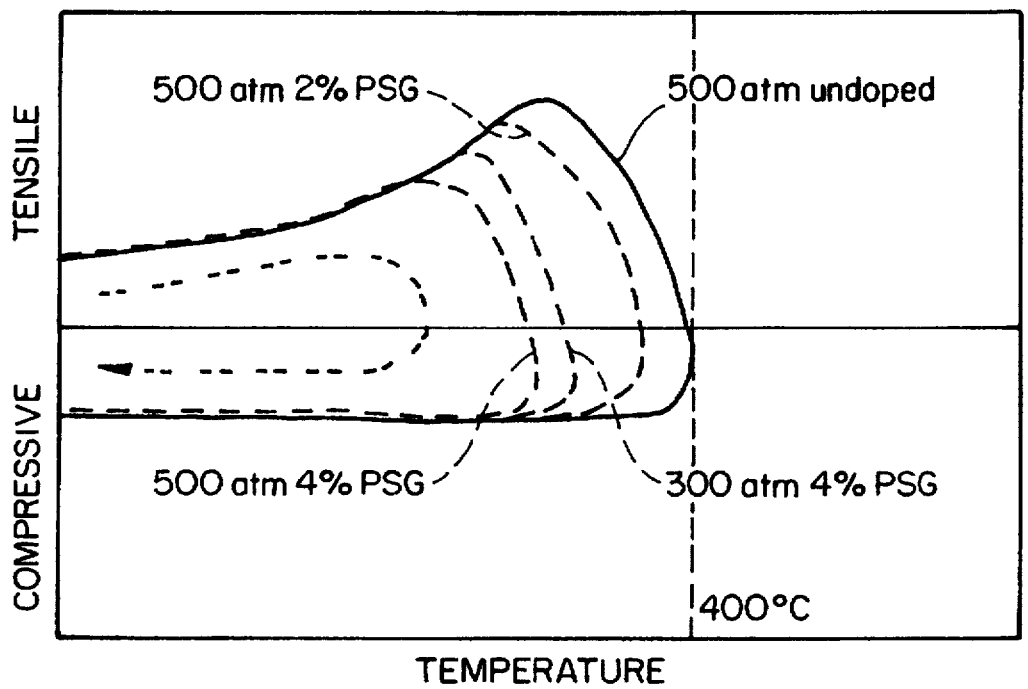
FIG_4

METHOD OF STRESS-RELIEVING SILICON OXIDE FILMS

BRIEF SUMMARY OF THE INVENTION

This invention relates generally to a method of stress relieving APCVD silicon oxide based films, and more particularly to a method of converting tensile stress to compressive stress in such films by processing at high pressure and low temperature.

BACKGROUND OF THE INVENTION

Tetraethoxysilane (TEOS) has been used extensively as the source material for atmospheric pressure chemical vapor deposition (APCVD) or subatmospheric pressure CVD (SACVD) of silicon oxide films on semiconductor wafers. APCVD deposition of silicon dioxide ($SiO_2$) films at low temperatures using an alkoxysilane such as TEOS and ozone is described in U.S. Pat. No. 4,845,054. Other precursors have also been used extensively to deposit silicon oxide films, such and silane and oxygen, as well as dopants of boron and/or phosphorous to create doped oxide films such as borophosphosilicate (BPSG) glass. The oxide films are used to fill gaps between adjacent metal lines in integrated circuits and for interlayer dielectric isolation.

A drawback of prior art APCVD TEOS/ozone films is that they are under tensile stress. The tensile stress can lead to cracking of the film. Further, the films are unstable and provide dielectric isolation over limited periods.

It is known that by increasing the pressure at which borophosphosilicate glass films are deposited the flow temperature of the film is reduced. This is important in that lower processing temperatures cause less thermal damage to the underlying integrated circuits. It is also known that at atmospheric pressure, the tensile stress of APCVD films will convert from tensile to compressive stress at about 750° C. However, conversion at these temperatures is likely to cause thermal damage to the underlying integrated circuit. Accordingly, it is desirable to provide a process for converting tensile stress in oxide films to compressive stress at temperatures that doe not damage the underlying integrated circuit.

OBJECTS AND SUMMARY OF THE INVENTION

It is an object of this invention to provide a method for converting tensilely stressed deposited oxide films to compressively stressed films.

It is another object of the invention to provide a method for low-temperature conversion of tensile stress in an APCVD TEOS/ozone film to compressive stress.

In accordance with the invention, tensile stress is converted to compressive stress in an APCVD oxide film by subjecting the film to pressures above atmospheric pressure and to temperatures below the conversion temperature at atmospheric pressure.

BRIEF DESCRIPTION OF THE DRAWINGS

The foregoing and other objects of the invention will be more fully understood from the following description when read in connection with the accompanying drawings, wherein:

FIG. 1 is a schematic representation of an APCVD apparatus and an annealing apparatus.

FIG. 2 shows stress in an APCVD oxide film as a function of temperature at one atmosphere of pressure.

FIG. 3 shows stress in an APCVD oxide film as a function of temperature at various pressures in accordance with the present invention.

FIG. 4 shows stress in an APCVD oxide film doped with phosphorous as a function of temperature at various pressures in accordance with the present invention.

DESCRIPTION OF PREFERRED EMBODIMENTS

The apparatus shown in FIG. 1 is suitable for carrying out the invention. In an exemplary embodiment, an APCVD module 11 is used to deposit the $SiO_2$ film by the decomposition of TEOS in the presence of ozone. Other suitable chemical precursors may be used to deposit the oxide film, and deposition of $SiO_2$ films is well-known and is described, for example, in U.S. Pat. Nos. 3,934,060 and 4,845,054, among others. The wafer with deposited dielectric film is placed in an annealing chamber 12 where it is subjected to elevated temperature and pressure. During annealing, tensile stress is converted to compressive stress at an elevated temperature which is dependent on pressure. In the prior art, the wafer was subjected to temperatures above 750° C. at atmospheric pressure for a period of minutes. FIG. 2 shows how the tensile stress increases as the temperature increases, and then decreases to zero at 750° C. and is converted to compressive stress as the temperature decreases. Annealing at these elevated temperatures thermally stresses the integrated circuits, for instance by causing dopants in the integrated circuit to redistribute. Furthermore, other material degradation occurs, such as the melting of aluminum interconnect lines.

In accordance with the present invention, the annealing chamber 12 is capable of sustaining high pressures. The wafer with the deposited dielectric film is placed in the chamber and the pressure in the chamber is increased to a predetermined pressure. The temperature is increased and maintained for a predetermined period of time. The stress is converted from tensile to compressive at lower temperatures.

Referring to FIG. 3, the stress conversion temperature decreases with increasing pressure. Stress conversion permits the dielectric layer to smooth out and to better fill gaps. This, in turn, will permit the use of oxide films in high density integrated circuits while minimizing damage to the underlying integrated circuits.

Doped silicon oxide (glass) films are known to flow at lower temperatures for topography smoothing applications and planarization processes when boron and/or phosphorous is added. Of particular advantage, the addition of phosphorous or boron to deposited oxide films will further reduce the stress conversion temperature. This aspect of the invention is illustrated in FIG. 4.

Currently, with conventional methods, the thickness of the deposited film is limited. Thick films tend to crack and are not useful for integrated circuit applications. However, if thin films are processed in accordance with the teaching of the present invention, they can be subjected to repeated deposition and annealing steps. This is schematically illustrated by the dotted arrow 13 in FIG. 1, which illustrates the return of a wafer processed in accordance with the invention to the deposition module 11.

Thus, there has been provided a method of processing TEOS/ozone silicon oxide films at low temperatures, making such films useful in high density integrated circuit applications.

What is claimed:

1. A method of converting tensile stress to compressive stress in an APCVD oxide film which comprises the step of: after depositing said oxide film, subjecting the oxide film to pressures above atmospheric pressure and temperatures below the atmospheric pressure conversion temperature, said atmospheric pressure conversion temperature being where the tensile stress in said oxide film converts to compressive stress at atmospheric pressure.

2. The method as in claim 1 wherein the APCVD oxide film is formed by reacting an alkoxysilane and ozone.

3. The method of claim 1 wherein the APCVD oxide film is formed by reacting TEOS and ozone.

4. The method of claim 1 wherein the APCVD oxide film is doped with boron.

5. The method of claim 1 wherein the APCVD oxide film is doped with phosphorus.

6. The method of claim 1 wherein the APCVD oxide film is doped with boron and phosphorus.

7. The method of claim 1 wherein said pressures are in the range of approximately 2 atmospheres to 500 atmospheres.

8. The method of claim 1 wherein said temperatures are in the range of approximately 740° C. to 200° C.

9. The method of claim 1 wherein said temperatures are in the range of equal to or less than approximately 400° C.

10. A method of converting tensile stress to compressive stress in an APCVD oxide film which comprises the step of: after depositing said oxide film, subjecting the oxide film to pressures in the range of equal to or less than approximately 500 atmospheres, and temperatures in the range of equal to or less than approximately 400° C.

11. The method as in claim 10 wherein the APCVD oxide film is formed by reacting an alkoxysilane and ozone.

12. The method of claim 10 wherein the APCVD oxide film is formed by reacting TEOS and ozone.

13. The method of claim 10 wherein the APCVD oxide film is doped with boron.

14. The method of claim 10 wherein the APCVD oxide film is doped with phosphorus.

15. The method of claim 10 wherein the APCVD oxide film is doped with boron and phosphorus.

16. The method of claim 10 wherein said APCVD oxide film contains phosphorus in the range of approximately 2 to 4 percent phosphorus by concentration.

17. A method of forming a silicon oxide film having compressive stress, on a substrate by CVD, comprising the steps of:

reacting a silicon precursor and an oxygen precursor in an CVD chamber, whereby said precursors interact proximate the surface of said substrate to form a silicon oxide film on said surface;

removing said substrate from said CVD chamber;

placing said substrate in an annealing chamber; and subjecting said substrate to pressures above atmospheric pressure and temperatures below the atmospheric pressure conversion temperature said atmospheric pressure temperature being where the tensile stress in said oxide film converts to compressive stress at atmospheric pressure, thereby converting the oxide film on said substrate from tensile stress to compressive stress.

18. The method of claim 17 further comprising repeating each of said reacting and subjecting steps to form additional silicon oxide films on the surface of said substrate.

19. The method of claim 17 wherein said reacting step further comprises reacting a dopant precursor to form a doped silicon oxide film on the surface of said substrate.

* * * * *